United States Patent [19]
Asahara et al.

[11] 3,969,678
[45] July 13, 1976

[54] BAND PASS FILTER CIRCUIT WITH AUTOMATIC BANDWIDTH ADJUST

[75] Inventors: Masaru Asahara, Kawasaki; Noriyasu Toyonaga; Hiroaki Ohyama, both of Tokyo; Hiroshi Nakamura, Sagamihara; Ryushiro Yoshizawa, Yokohama, all of Japan

[73] Assignee: Fujitsu Ltd., Japan

[22] Filed: July 3, 1975

[21] Appl. No.: 593,126

[30] Foreign Application Priority Data
July 8, 1974  Japan................................ 49-78059

[52] U.S. Cl................................. 328/167; 328/155; 307/320; 333/17 R; 333/70 R
[51] Int. Cl.² ............................................ H03G 5/22
[58] Field of Search .............. 328/167, 155; 330/31; 333/17 R, 70 R; 307/295, 320

[56] References Cited
UNITED STATES PATENTS

| | | | |
|---|---|---|---|
| 3,714,588 | 1/1973 | Deboo et al. ........................ | 328/167 |
| 3,753,159 | 8/1973 | Burwen................................. | 333/17 |
| 3,786,363 | 1/1974 | Lelie ..................................... | 330/31 |
| 3,805,173 | 4/1974 | Nakamura et al. .................. | 328/155 |
| 3,835,399 | 9/1974 | Holmes............................... | 328/167 |

*Primary Examiner*—John S. Heyman
*Attorney, Agent, or Firm*—Staas & Halsey

[57] ABSTRACT

Band pass filter circuit for a band pass filter which detects a phase difference between input and output signals of said band pass filter, and the detected output controls, via a low pass filter, a voltage controlled oscillator, the output of which controls first and second mixers connected respectively to an input side and an output side of the band pass filter, so that the output of the first mixer can be maintained at the center frequency of said band pass filter. Further, when an irregularly timed signal is received, before an input signal is pulled in the synchronized state, said band pass filter is provided with a wide pass band so as to pull the signal in the synchronized state in rapidly. After said input signal is pulled in said center frequency, the pass band of said band pass filter is changed to a narrow bandwidth so as to improve the quality of the noise and at the same time, a cutoff frequency of said low pass filter is changed to a lower frequency side so as to improve the stability of the band pass filter circuit.

5 Claims, 13 Drawing Figures

BAND PASS FILTER CIRCUIT WITH AUTOMATIC BANDWIDTH ADJUST

The present invention relates to a band pass filter circuit for a band pass filter, more particularly, to a band pass filter circuit which can change the bandwidth of the band pass filter.

In a PCM (Pulse Code Modulation) — PSK (Phase Shift Keying) communication system such as PCM (Pulse Code Modulation) — TDMA (Time Division Multiple Access), SPADE (Single Channel per carrier PCM multiple Access Demand assignment Equipment) or SCPC (Single Channel per Carrier), a carrier wave regeneration circuit used in the received side of the system definitely requires rapid response and low noise characteristcs. The carrier wave regeneration circuit is generally composed of a carrier extracting circuit which extracts a carrier wave component from a phase modulated input signal wave which does not include a carrier wave, and a band pass filter circuit which filters the extracted carrier wave component. As the center frequency of an input signal varies, the center frequency of the band pass filter should also vary in accordance with said variation of the center frequency of the input signal. Therefore, a phase lock loop is conventionally applied to the band pass filter. The applicants have already filed an application entitled "A Band Pass Filter and Phase Control Circuit Eliminating Phase Differences Between Inputs and Outputs" in several countries. (Japanese Application No. 369,254 filed June 14, 1972; U.S. Pat. No. 3,805,173 patented April 16, 1974; United Kingdom patent application No. 28242/73; German patent application No. P2330357.3; French patent application No. 73.21646; Italian patent application No. 25099A/73; and Canadian patent application No. 173,991).

According to the applicant's circuit, a difference in the phases between the input signal and the output signal of the band pass filter is detected by a phase detector and the output of the phase detector controls, via a low pass filter, a voltage controlled oscillator. The output of said voltage controlled oscillator is supplied to the first mixer and the second mixer which are respectively positioned at the input and output sides of the band pass filter. When the frequency of an input signal to the first mixer is $F_{in}$ and the frequency of the output of the voltage controlled oscillator is $F_v$, the frequency of the signal which passes the band pass filter is $(F_{in}-F_v)$. If we assume that the frequency $(F_{in}-F_v)$ is equal to the center frequency $f_o$ of the band pass filter and the frequency $F_{in}$ of the input signal shifts, a phase difference is caused between the input and the output of the band pass filter. The signal which corresponds with the above-mentioned phase difference is obtained at the output of the phase detector and said signal is applied via the low pass filter, to said voltage controlled oscillator. Said voltage controlled oscillator is controlled, so that its output frequency $F_v$ varies and the output frequency $(F_{in}-F_v)$ of the first mixer is always maintained at the center frequency $f_o$ of the band pass filter. Therefore, when the input frequency $F_{in}$ varies, the frequency of the signal to be filtered becomes the center frequency $f_o$ of the band pass filter.

When the received signal is irregularly timed such as that used in a PCM - TDMA system, the above-mentioned circuit can be used as a mean value automatic frequency control circuit by using a large time constant circuit in the low pass filter.

However, when said received signal is an intermittent signal, for example, such as that used in SPADE or SCPC systems, a speed automatic control circuit is needed in order to instantaneously pull in the received signal. The object of pulling in the received signal can be achieved by increasing the bandwidth of the band pass filter. However, this increase of the bandwidth will cause inferior quality of the noise.

For the purpose of removing the above-mentioned inconvenience and improving the quality of the noise a two mode exchange system is proposed, which has a wide pass band before the signal is pulled in the synchronized state. After said input signal is pulled in the synchronized state, the pass band of said band pass filter is exchanged to a narrow bandwidth is proposed. However, in the two mode exchange systems, when the bandwidth of the band pass filter is changed to a narrow bandwidth, the bandwidth of the band pass filter approaches the cutoff frequency of the low pass filter, and the values of the time constants of the band pass filter and the low pass filter become nearly equal. Therefore, if the band pass filter and the low pass filter respectively have the function of the first order transfer, the transfer function of the whole equivalent filter of the automatic frequency control becomes the second order function, so that the circuit becomes unstable.

The object of the present invention is to remove the above-mentioned problem and to improve the stability of the two mode exchange system, by changing the bandwidth of the band pass filter and at the same time changing the cutoff frequency of the low pass filter which supplies the control signal to the voltage controlled oscillator.

A further object of the present invention is to provide a band pass filter circuit which can continuously change the bandwidth of its band pass filter but can continue to maintain the center frequency of the band pass filter at a constant value.

According to the present invention a band pass filter circuit for a band pass filter detects a phase difference between input and output signals of said band pass filter and the detected output controls, via a low pass filter, a voltage controlled oscillator, the output of which controls first and second mixers connected respectively to an input side and an output side of the band pass filter, so that the output of the first mixer can be maintained at the center frequency of the band pass filter. Further, when an intermittent signal is received, before said signal is pulled in the synchronized state, said band pass filter is provided with a wide pass band. After said input signal is pulled in said center frequency, the pass band of said band pass filter is changed to a narrow bandwidth and the cutoff frequency of said low pass filter is changed to a lower frequency, so that the quality of the noise of the band pass filter can be improved and also the band pass filter circuit can be stabilized.

Further features and advantages of the present invention will be apparent from the ensuing description with reference to the accompanying drawings to which, however, the scope of the invention is in no way limited.

Figure 1:
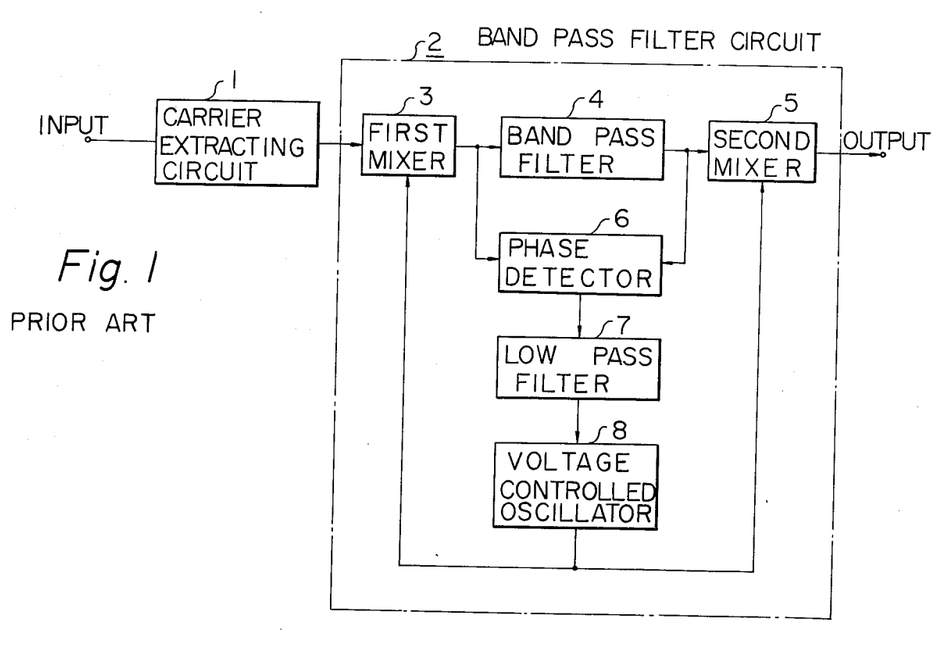
FIG. 1 is a block diagram of an embodiment of a conventional band pass filter circuit.

FIG. 1 is an example of a carrier wave regenerator circuit including the aforementioned conventional band pass filter circuit of the applicant. A phase shift keying modulated signal which is received by an input terminal is supplied via a carrier extracting circuit 1 to a first mixer 3 of the band pass filter circuit 2. The output of the first mixer 3 is sent out via a band pass filter 4 and a second mixer 5. In the circuit of the band pass filter circuit 2, a difference in the phases between the input signal and the output signal of the band pass filter 4 is detected by a phase detector 6 and the output of said phase detector controls, via a low pass filter 7, a voltage controlled oscillator 8. The output of the voltage controlled oscillator 8 is supplied to the first mixer 3 and the second mixer 5. When the frequency of an input signal to the first mixer 3 is $F_{in}$ and the frequency of the output of the voltage controlled oscillator 8 is $F_v$, the frequency of the signal which passes the band pass filter 4 is $(F_{in} - F_v)$. If we assume that the frequency $(F_{in} - F_v)$ is equal to a center frequency $f_o$ of the band pass filter 4 and that the frequency $F_{in}$ of the input signal shifts, phase difference occurs between the input and the output of the band pass filter 4. The signal which corresponds with the above-mentioned phase difference is obtained at the output of the phase detector 6 and said signal is applied via the low pass filter 7, to the voltage controlled oscillator 8. The voltage controlled oscillator is controlled so that its output frequency $F_v$ varies and the output frequency $(F_{in} - F_v)$ of the first mixer 3 is always maintained at the center frequency $f_o$ of the band pass filter 4. Therefore, when the input frequency $F_{in}$ varies, the frequency of the signal to be filtered becomes the center frequency $f_o$ of the band pass filter 4.

Figure 2A:
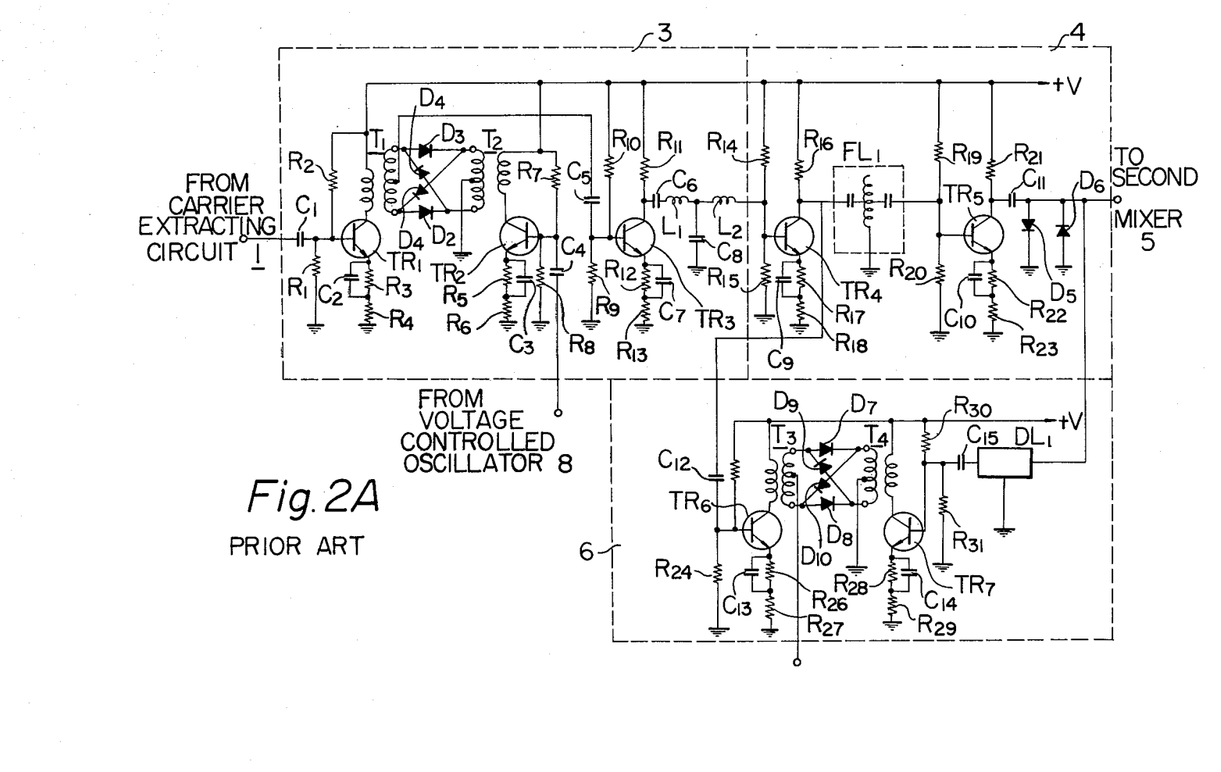
FIGS. 2A and 2B are circuit diagrams of the embodiment of FIG. 1 of a conventional band pass filter circuit.
Figure 2B:
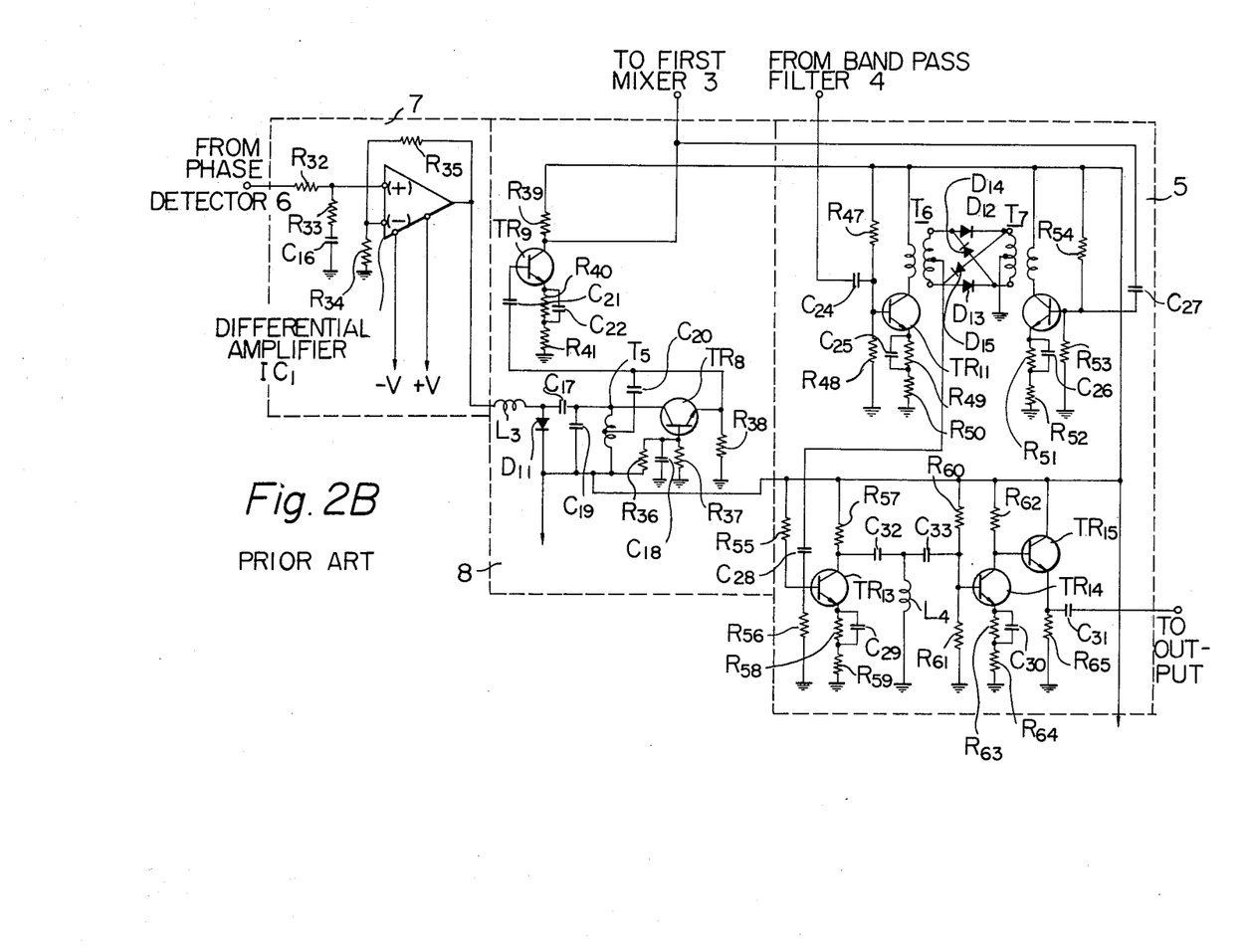

In FIG. 1, the carrier extracting circuit can be placed between the first mixer 3 and the band pass filter 4. In this case, after the input phase shifted key signal is frequency converted by the first mixer the carrier wave is extracted. Thus the output frequency of the voltage controlled circuit should be suitably selected so as to conform to said circuit. Detailed circuits of the block diagram shown in FIG. 1 are shown in FIGS. 2A and 2B. Referring to FIG. 2A, transistors $TR_1$, $TR_2$ and $TR_3$ of the first mixer are connected with the capacitors $C_1$ to $C_7$ and resistors $R_1$ to $R_{13}$ as common emitter amplifiers. Transformers $T_1$ and $T_2$ and diodes $D_1$ to $D_4$ are connected as a double balanced mixer. Inductors $L_1$ and $L_2$ and the capacitor $C_8$ are connected as a low pass filter.

The signal from the carrier extracting circuit at the input terminal is amplified by the transistor amplifier $TR_1$ and is mixed by the double balanced mixer with the output signal of the voltage controlled oscillator 8 which signal is supplied to the first mixer. The signal from said voltage controlled oscillator 8 is supplied to the transistor amplifier $TR_2$. The signal is subjected to beat down in the double balanced mixer and is passed through the transistor amplifier $TR_3$. Unnecessary spurious noise is filtered by the low pass filter. The output signal of the low pass filter is fed to the band pass filter 4.

Transistors $TR_4$ and $TR_5$, capacitors $C_9$ to $C_{11}$ and resistors $R_{14}$ to $R_{23}$ of the band pass filter 4 function as two sets of common emitter type amplifiers. Diodes $D_5$ and $D_6$ function as an amplitude limiters. Helical filter Fil 1 functions as the band pass filter. The helical filter has a center frequency $f_o = f_i - f_{VCO}$, wherein $f_i$ is the input frequency and $f_{VCO}$ is the frequency of oscillation of the voltage controlled oscillator 8. The helical filter is a distributed constant type filter, assuring realization of a high Q.

The signal from the first mixer is amplified by the transistor $TR_4$ of the band pass filter 4 and is applied to the band pass helical filter Fil 1. After the noise is eliminated in the band pass helical filter, the signal is supplied to an amplitude limiter $D_5$, $D_6$. The output of the amplitude limiter $D_5$, $D_6$ is divided into two and is fed to the second mixer and the phase detector 6.

Transistors $TR_6$ and $TR_7$, capacitors $C_{12}$ to $C_{15}$ and resistors $R_{24}$ to $R_{31}$ of the phase detector 8 function as two sets of common emitter type amplifiers. Transformers $T_3$ and $T_4$ and diodes $D_7$ to $D_{10}$ function as a double balanced mixer type phase detector. The delay line provides a phase shift of DL1 $\tau/2$ radian for the center frequency $f_o$. The phase detector 6 provides a phase comparison between the helical filter input signal, which is obtained via the transistor amplifier $TR_4$ of the band pass filter 4 and the output signal of the amplitude limiter $D_5$, $D_6$. The signals are amplified by the transistor amplifier $TR_6$ and the transistor amplifier $TR_7$, respectively, and are then supplied to the double balanced type phase detector $D_7$ to $D_{10}$, $T_3$, $T_4$. The $DL_1$ delay line is provided for adjusting phase bias in the double balanced type phase detector. The output of the double balanced type phase detector of the phase detector 6 is fed to the low pass filter 7 of FIG. 2B.

Resistors $R_{32}$ and $R_{33}$ and the capacitor $C_{16}$ function as a low pass filter in the low pass filter 7. Differential amplifier $IC_1$ capacitor $C_{16}$ and resistors $R_{34}$ and $R_{35}$ function as a DC amplifier. The output signal from the phase detector 6 of FIG. 2A passes through the low pass filter 7, is amplified by the DC amplifier, which includes the differential amplifier IC, and is supplied to the voltage controlled oscillator 8.

Transistor $TR_8$, capacitors $C_{17}$ to $C_{19}$, resistors $R_{36}$ to $R_{38}$, inductor $L_3$ and the variable capacitance diode $D_{11}$ of the voltage controlled oscillator 8 function as a Hartley type voltage controlled oscillator. Transistor $TR_9$, capacitors $C_{20}$ and $C_{21}$ and the resistors $R_{39}$ to $R_{41}$ function as a common emitter type amplifier. The output signal of the low pass filter is supplied to the voltage controlled oscillator 8.

The output of the voltage controlled oscillator 8 is then amplified by the transistor $TR_9$. The output of the transistor $TR_9$ is supplied to the first and second mixers 3 and 5.

Transistors $TR_{11}$ to $TR_{14}$, the resistors $R_{47}$ to $R_{64}$ and capacitors $C_{23}$ to $C_{30}$ of the second mixer 5 function as four sets of common emitter type amplifiers. Transformers $T_6$ and $T_7$, and diodes $D_{12}$ to $D_{15}$ function as a double balanced mixer. Transistor $TR_{15}$, resistor $R_{65}$ and capacitor $C_{30}$ function as a common collector type amplifier. Capacitors $C_{31}$ and $C_{32}$ and inductor $L_4$ function as a high pass filter. The output signal from the band pass filter 4 of FIG. 2A is fed mixed with the output signal from the voltage controlled oscillator 8 at the double balanced mixer $D_{12}$ to $D_{15}$, $T_6$ and $T_7$, and is finally subjected to beat-up.

The output of the double balanced mixer is amplified by the transistor amplifier $TR_{13}$. Unnecessary spurious noises are then cut off at the high pass filter $C_{32}$, $C_{33}$, $L_4$. The output of the high pass filter is transferred to the output via the transistor amplifiers $TR_{14}$ and $TR_{15}$.

Figure 3:
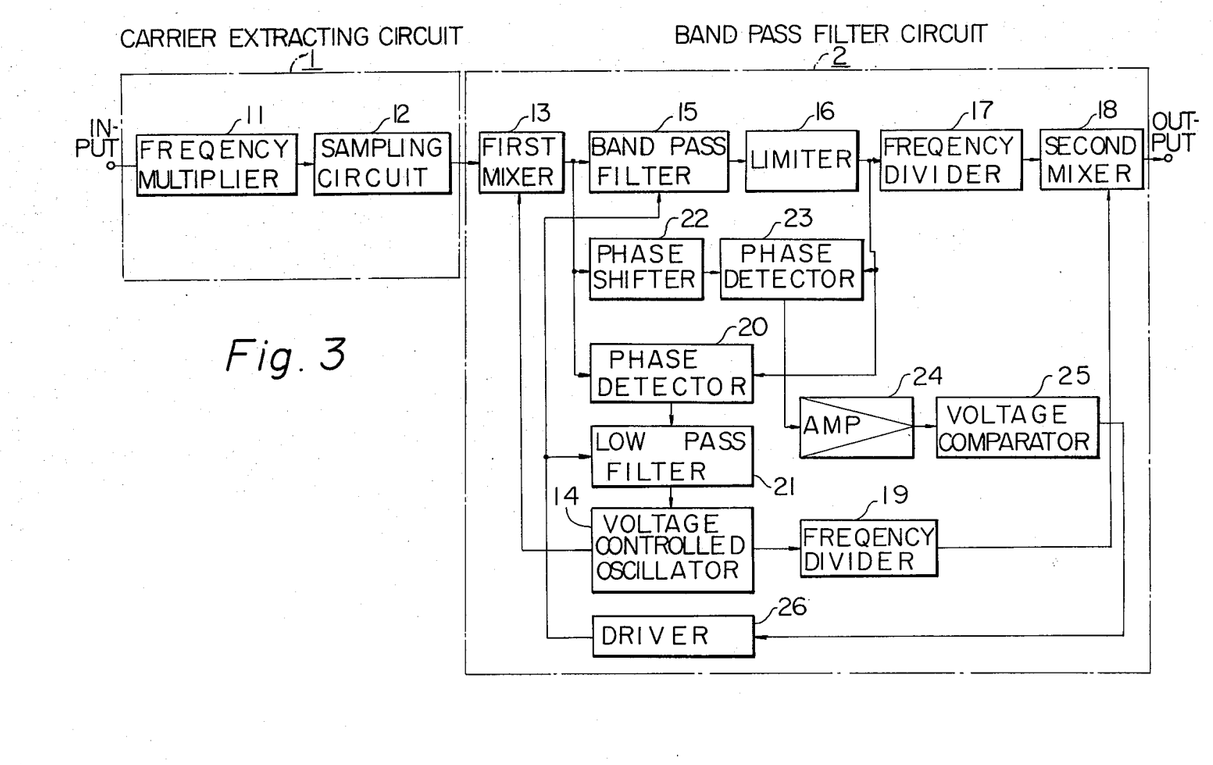
FIG. 3 is a block diagram of an embodiment of a band pass filter circuit according to the present invention.

FIG. 3 shows one embodiment of the band pass filter according to the present invention. The frequency of an input signal which is phase shift key modulated and is received by the input signal is multiplied by a frequency multiplier 11 by the number of phase shift key phases of the input signal. A sampling circuit 12 samples a center portion where the phases of the input signal coincide and the output of the sampling circuit is supplied to a first mixer 13 where the frequency of the input signal is converted into as intermediate frequency by the output of the voltage controlled oscillator 14. The output signal of the first mixer 13 is applied to a band pass filter 15, which limits the bandwidth of the signal and then, said signal is applied to a limiter 16, which limits the amplitude of said signal. Next, the output of the limiter 16 is applied to a frequency divider 17 where the frequency of the signal is demultiplied the same number of times as multiplied by the frequency multiplier. The output of said frequency divider is applied to a second mixer 18 which generates a carrier wave having a frequency equal to the input frequency of the frequency multiplier 11.

A phase detector 20 detects the phase difference between the input and the output of the band pass filter 15, and the voltage corresponding to the phase difference is supplied via a low pass filter 21 to the voltage controlled oscillator 14 so as to control the output frequency of said oscillator, so that the intermediate frequency becomes the center frequency $f_o$ of the band pass filter 15. Further, according to the present invention, the synchronized condition of the signal applied to the band pass filter is detected by a 90° phase shifter 22, a phase detector 23, an amplifier 24 and a voltage comparator 25. When the phase difference between the input and the output of the band pass filter 15 is zero, a maximum output can be obtained from the phase detector 23. The voltage comparator 25 detects the maximum value of the applied signal which value is larger than the threshold level, so that a synchronized condition can be established. The output of the voltage comparator 25 is supplied, via a driver 26, to the band pass filter 15 and to the low pass filter 21. The output of the voltage comparator 25 can be applied directly to the low pass filter 22.

Referring to the circuit shown in FIG. 3, before the synchronized condition of the applied input signal is established, the bandwidth of the band pass filter 15 is widened and the cutoff frequency of the low pass filter 21 is shifted to a high frequency region. Therefore, if a burst of input signals arrive, rapid synchronization can be realized. After synchronization is established, the bandwidth of the band pass filter 15 is narrowed and the cutoff frequency of the low pass filter 21 is changed to a low frequency region, by the exchange signal SY obtained at the output of the voltage comparator 25.

Figure 4:
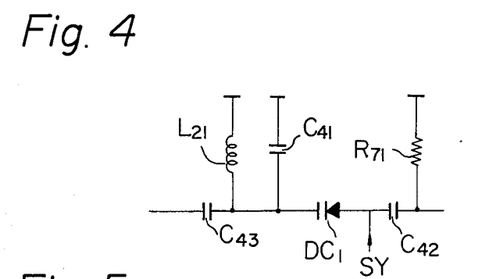
FIG. 4 is a circuit diagram of the embodiment of the band pass filter shown in FIG. 3.

FIG. 4 is one example of the band pass filter 15 according to the present invention. Referring to FIG. 4, a parallel resonance circuit which is composed of an inductor 121 and a capacitor 41 is connected between an input coupling capacitor $C_{43}$ and the ground. One terminal of a vari-cap diode $DC_1$ is connected to a junction point of the capacitor and the resonance circuit, and another terminal of the vari-cap diode $DC_1$ is connected via a coupling capacitor 42 to one terminal of a load resistor $R_{71}$ whose other terminal is grounded. The capacitance of the vari-cap diode $DC_1$ is varied by the exchange signal SY (having negative polarity) from the voltage comparator 25 so that the band pass of the resonance circuit is varied by changing its Q. It should be noted that the circuit shown in FIG. 4 is used in place of the helical filter Fil 1 shown in FIG. 2A. The construction of the band pass filter is the same as the band pass filter 14 of FIG. 2A where the helical filter Fil 1 is substituted for the circuit shown in FIG. 4.

Figure 5:
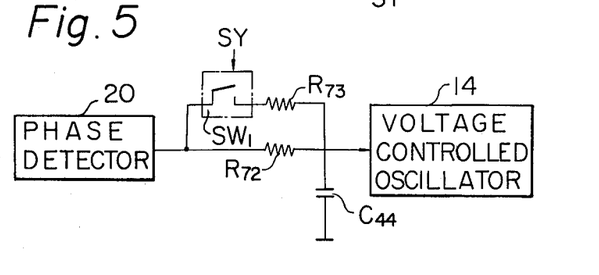
FIG. 5 is a block diagram of the low pass filter shown in FIG. 3.

FIG. 5 shows the circuit of the low pass filter 21 according to the present invention. When a switch $SW_1$ which is controlled by the exchange signal SY is closed, a resistor 72 is parallel connected to a resistor 71, and the time constant, is $$\frac{C_{44}R_{71}R_{72}}{R_{71} + R_{72}}$$

so that the cutoff frequency of the low pass filter 21 becomes higher. When the switch SW is opened, the time constant becomes $CR_1$ so that the cutoff frequency of the low pass filter becomes lower. The switch $SW_1$ can be realized by using a semi-conductor element. Using the circuit shown in FIGS. 4 and 5, before the synchronized condition is established, a reverse voltage is supplied to the vari-cap diode $DC_1$ so that the bandwidth of the band pass filter 15 becomes wide, and the switch $SW_1$ is closed so that the cutoff frequency of the low pass filter 21 also becomes high, thereby synchronization of the automatic frequency control system can be rapidly established. When the synchronized condition is established in the automatic frequency control system, the capacitance of the vari-cap diode DC is reduced by the voltage applied to said diode $DC_1$ so that the bandwidth of the band pass filter 15 becomes narrow and the switch $SW_1$ is opened so that the cutoff frequency of the low pass filter becomes low. The changes of the frequency bandwidth of the band pass filter 15 and the cutoff frequency of the low pass filter is controlled so that the ratio of the frequency bandwidth and the cutoff frequency is nearly equal.

Figure 6:
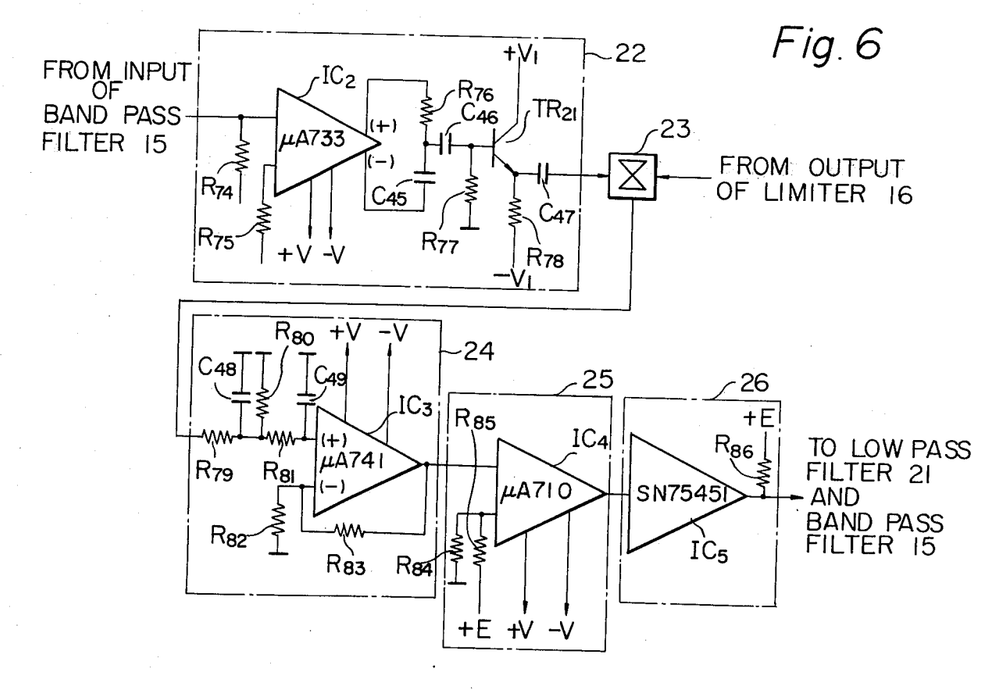
FIG. 6 is a circuit diagram of an embodiment of the phase shifter, the amplifier and the voltage comparator shown in FIG. 3.
Figure 7:
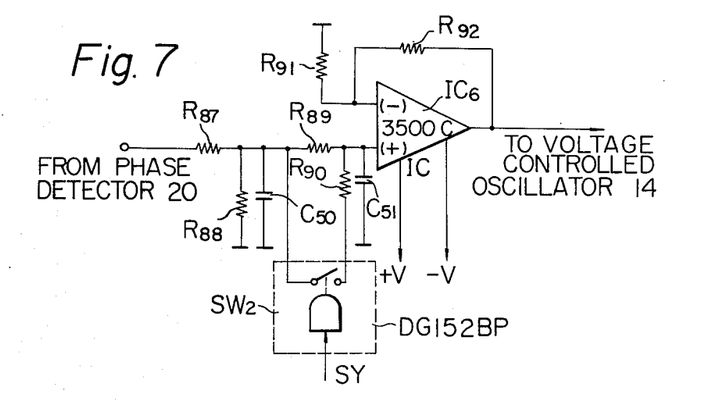
FIG. 7 is a circuit diagram of the embodiment of the low pass filter of FIG. 5.

FIGS. 6 and 7 show the actual circuits of the essential portions of the band pass filter circuit shown in FIG. 3. The portions of the band pass filter circuit which are not shown in FIGS. 6 and 7 are similar to the corresponding circuit shown in FIGS. 2A, 2B and in FIG. 4.

Referring to FIG. 6, an integrated circuit $IC_2$ (Fairchild $\mu$A733) is connected with resistors $R_{74}$ and $R_{75}$ so as to make a phase inverter circuit. The output of the integrated circuit $IC_2$ is connected to a phase shifter circuit which is composed of a resistor $R_{76}$ and a capacitor 45 and shifts the input signal by 90°. The output of the phase shifter circuit is connected via a coupling circuit composed of a capacitor $C_{46}$ and a resistor $R_{77}$ to the base of a transistor $TR_{21}$. Said transistor $TR_{21}$ is connected with resistors $R_{77}$ and $R_{78}$ as an emitter follower for matching an input impedance to an output impedance. The output of the transistor $R_{21}$ is connected via a capacitor $C_{47}$ to one input terminal of a mixer 23 which forms a phase detector. The output of the limiter 16 shown in FIG. 3 is applied to another input terminal of the mixer 23. The output impedance of the mixer 23 is matched by a circuit which includes resistors $R_{79}$ (about 50 ohms) and $R_{80}$ and a by-pass capacitor $C_{48}$ and the output of the mixer 23 is supplied via an integrator which is composed of a resistor $R_{81}$ and a capacitor $C_{49}$, to an integrated circuit $IC_3$ ($\mu A$ 741 Fairchild) which forms a direct current amplifier with resistors $R_{84}$ and $R_{85}$. The output of the integrated circuit $IC_3$ is supplied to the voltage comparator circuit 25 which is composed of an integrated circuit $IC_4$ ($\mu A$ 710 Fairchild) and resistors $R_{84}$ and $R_{85}$. A voltage divider which is composed of the resistors $R_{84}$ and $R_{85}$ is provided for determining the threshold level of the circuit 25. The output of the circuit 25 is supplied to the driver 26 which is composed of an integrated circuit $IC_5$ (SN 75451 Texas Instrument) and to a resistor $R_{86}$ so that zero volts or E volts are obtained at the output of the driver 26. That is, the exchange signal SY is obtained at the output of the driver 26. However, it is possible for the driver 26 to be omitted.

FIG. 7 is a detailed circuit of the low pass filter shown in FIG. 5. The output impedance of the phase detector 20 is matched by a circuit which is composed of resistors $R_{87}$ (about 50 ohms) and $R_{88}$ and a capacitor $C_{50}$. The output of said circuit is supplied to an integrating circuit which is composed of resistors $R_{89}$, $R_{90}$, a capacitor $C_{51}$ and a switch $SW_2$ (DC 152 BP Siliconix) which switch is controlled by the exchange signal SY. Said resistors, capacitor and switch correspond to the resistors $R_{72}$, $R_{73}$, capacitor $C_{44}$ and switch $SW_1$. The output of said integrating circuit is supplied via a direct current amplifier which is composed of an integrated circuit $IC_6$ 3500 C Burr Brown) and resistors $R_{91}$, $R_{92}$, to the voltage controlled oscillator 14.

Figure 8:
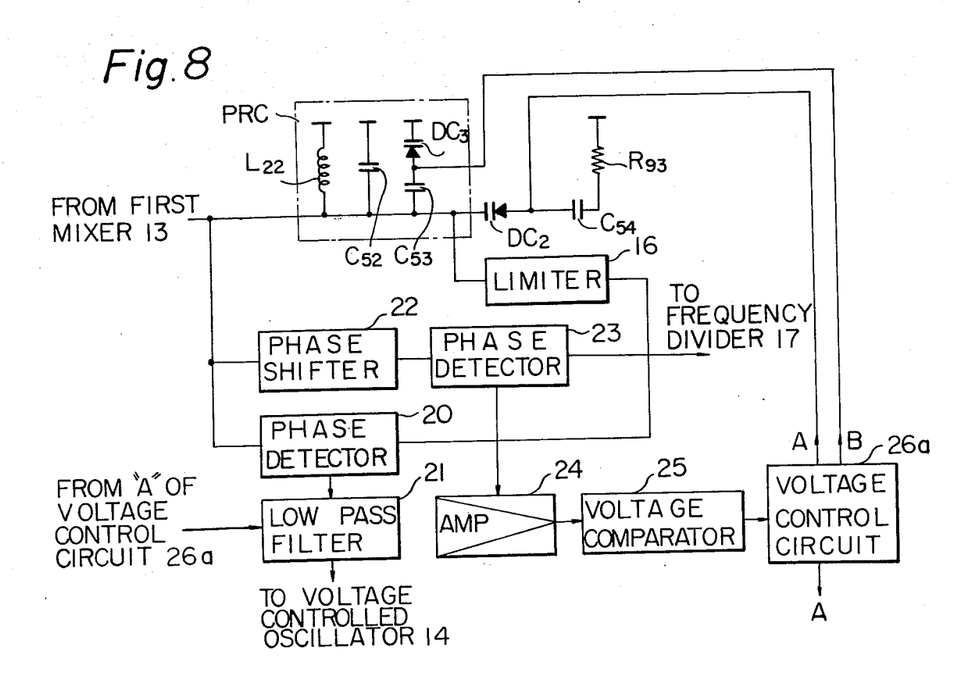
FIG. 8 is a block diagram of another embodiment of the band pass filter circuit according to the present invention.

As mentioned above, according to the present invention, the bandwidth of the band pass filter, as well as the cutoff frequency of the low pass filter which supplies the control voltage to the voltage controlled oscillator are changed, so that synchronization of the automatic frequency control system can be established and, after said synchronization is established, the quality of the noise of the system can be improved. Further, as the cutoff frequency of the low pass filter is changed with regard to the bandwidth of the band pass filter, the system can be stabilized. However, in the circuit shown in FIG. 3, the bandwidth of the band pass filter is changed by changing the value of the capacitor, inductor or the load resistor by controlling the switch. Therefore, when the bandwidth is changed, the system is in an unsynchronized state, that is, the center frequency of the band pass filter is shifted. A circuit which can remove the above-mentioned problems is shown in FIG. 8. In the circuit shown in FIG. 8, a band pass filter is composed of a parallel resonance circuit PRC composed of an inductor $L_{22}$, a capacitor $C_{52}$ and a series circuit of a capacitor $C_{53}$ and a vari-cap diode $DC_3$; a vari-cap diode $DC_2$ which changes the bandwidth; a coupling condenser $C_{54}$ and a load resistor $R_{93}$. The circuit shown in FIG. 8 shows only the portion corresponding to the circuit is the same as that of the band pass filter 4 of FIG. 2A except for substituting the helical filter Fil 1 for the circuit shown in FIG. 8. A phase detector 20, a low pass filter 21 are similar to those in FIG. 3 while a direct current amplifier 24, and a voltage comparator 25 are the same as those of FIG. 3.

As shown in FIG. 3, a phase detector 20 detects the phase difference between the input and the output of the parallel resonance circuit PRC, and the voltage corresponding to the phase difference is supplied via a low pass filter 21 to the voltage controlled oscillator 14 so as to control the output frequency of said oscillator; and when the phase difference between the input and the output of the parallel resonance circuit RRC is zero, a maximum output can be obtained at the output of the phase detector 23. Said output of the phase detector 23 is applied via a direct current amplifier 24, to a voltage comparator 25 which detects whether the output of the phase detector 23 reaches the maximum value or not. The output of said voltage comparator 25 is supplied to the voltage control circuit 26a.

The voltage control circuit 26a generates two outputs A and B. The voltage levels of these two outputs are selected so that one of said outputs is high while the other is low. That is, the two levels have opposite polarities. The output A is applied to the first vari-cap diode $DC_2$ and the output B is applied to the second vari-cap diode $DC_3$. The voltage control circuit 26a may be so constituted, for example, that the output of the voltage comparator 25 is split into two outputs, one of which is supplied via an inverter to the driver 26 shown in FIG. 6.

Figure 9:
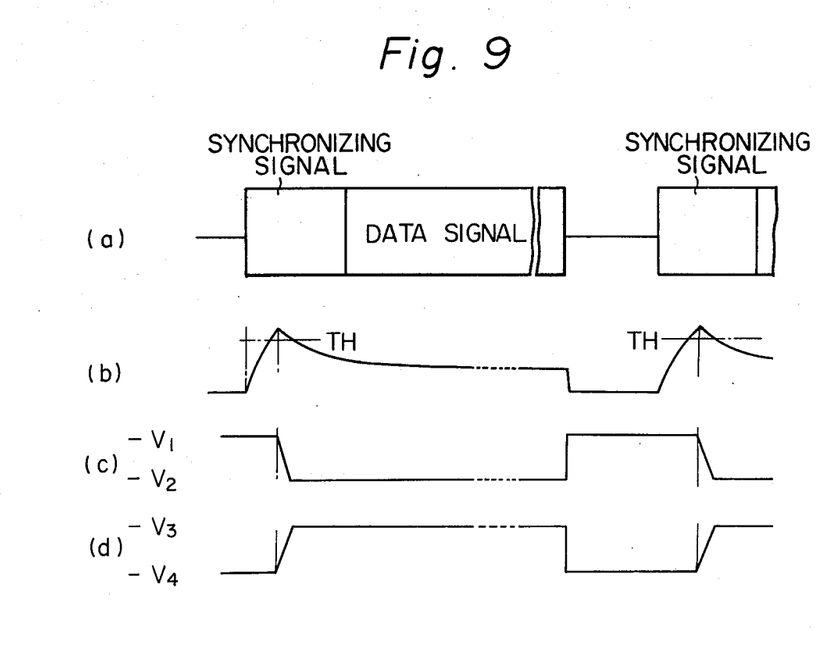
FIGS. 9(a) through 9(d) are waveforms in essential parts of the voltage control circuit shown in FIG. 8.

When a burst of signals composed of a synchronizing signal and a data signal combined, as shown in (a) of FIG. 9 is received by the circuit shown in FIG. 8, the output of the phase detector 23 varies as can be seen with reference to (b) in FIG. 9. The symbol TH indicates the threshold level of the voltage comparator 25. The output of the phase detector 23 is supplied to the voltage comparator 25 which detects the maximum value which is larger than the threshold level TH, and the detected signal is supplied to the voltage control circuit 26a. In said voltage control circuit 26a, the output A is changed from $-V_1$ to $-V_2$ as shown in (c) of FIG. 9, and the output B is changed from $-V_4$ to $-V_3$ as shown in (d) of FIG. 9.

When the output A is $-V_1$, the capacitance of the vari-cap diode $DC_2$ is large and the Q of the parallel resonance circuit PRC is small, so that the bandwidth of said circuit is widened and said circuit is placed in such a state that the synchronization can be rapidly established. When the burst signal is received and the synchronization is established, the value of the output A is made $-V_2$, so that the capacitance of the vari-cap diode $DC_2$ becomes small and the bandwidth of the parallel resonance circuit is narrowed, so that, after synchronization is established, the quality of the noise can be improved.

Further, according to the embodiment shown in FIG. 8, when the level of the output B is $-V_4$, the value of the capacitance of the vari-cap diode $DC_3$ is small. When the capacitance of the vari-cap diode $DC_2$ becomes small so that the bandwidth of the band pass filter becomes narrow, the capacitance of the vari-cap diode $DC_3$ is made large so that the capacitance with respect to the inductance $L_{21}$ is not changed and the center frequency of the filter is always maintained at a constant value.

In the circuit shown in FIG. 8, before the synchronized condition is established, the band pass filter has a wide band so that the synchronized condition can be rapidly established, after which, said filter has a narrow band so that the quality of the noise can be improved. This changing of the band from a wide band to a narrow band is carried out not by using the switch shown in FIGS. 5 and 7, but by changing the output voltage A which is continuously supplied to the vari-cap diode $DC_2$. Therefore, the exchange can be carried out smoothly without losing the synchronization.

Further, the variation of the center frequency of the band pass filter due to the variation of the capacitance of the vari-cap diode $DC_2$ can be compensated for by changing the variation of the capacitance of the vari-cap diode $DC_3$ by applying thereto the voltage B which inversely changes with respect to voltage A.

In the circuit shown in FIG. 8, the band width of the band pass filter is changed by the first vari-cap diode $DC_2$, and the shift of the center frequency of said filter is compensated for by the capacitance variation of the second vari-cap diode $DC_3$, so that the band pass filter which is obtained is suitable to be applied to the carrier wave regeneration circuit. And as the changing of the bandwidth is carried out smoothly, the bandwidth can be made narrow without losing synchronization.

What is claimed is:

1. A band pass filter circuit including a band pass filter, a first phase detector which detects phase differences between an input and an output of said band pass filter, a low pass filter which receives an output of said first phase detector, a voltage controlled oscillator which is controlled by an output of said low pass filter, first and second mixers which are respectively connected to the input side and the output side of said band pass filter and receive an output of said voltage controlled oscillator, so that an input signal frequency of said band pass filter is pulled into the center frequency of said band pass filter, said band pass filter circuit comprising means for providing a first signal to change a bandwidth of said band pass filter from a wide bandwidth to a narrow bandwidth and a second signal occurring simultaneously to change a cutoff frequency of said low pass filter from a higher frequency to a lower frequency when said input signal frequency is pulled into said center frequency of said band pass filter.

2. A band pass filter circuit according to claim 1, said providing means comprising a phase shifter which is connected to the input of said band pass filter, a second phase detector which is connected between the outputs of said phase shifter and said band pass filter, and a voltage comparator the input of which is connected to an output of said second phase detector.

3. A band pass filter circuit according to claim 2, wherein a filter circuit of said band pass filter comprises a parallel resonance circuit composed of an inductance element, a first capacitance element and a load resistance element parallelly connected via a first vari-cap diode to said parallel resonance circuit, said low pass filter comprising a variable time constant circuit.

4. A band pass filter circuit according to claim 3, said first signal being supplied from the output of said voltage comparator to said first vari-cap diode so as to decrease the capacitance of said first vari-cap diode, and said second signal being supplied from the output of said voltage comparator to said low pass filter so as to increase the time constant of said time constant circuit.

5. A band pass filter circuit according to claim 4, wherein said parallel resonance circuit further comprises a series circuit which is composed of a second vari-cap diode and a second diode which series circuit is parallelly connected to said parallel resonance circuit and the capacitance of said second diode is controlled by the output of said voltage comparator circuit so that, before said input signal is pulled into said center frequency, said capacitance is small, and after said input signal is pulled into said center frequency, said capacitance becomes larger.

* * * * *

UNITED STATES PATENT AND TRADEMARK OFFICE
CERTIFICATE OF CORRECTION

PATENT NO. : 3,969,678
DATED : July 13, 1976
INVENTOR(S) : Masaru Asahara et al

It is certified that error appears in the above-identified patent and that said Letters Patent are hereby corrected as shown below:

Column 6, line 26, change "parallel" to --parallelly--.
Column 7, line 39, before "3500" insert a parenthesis --(--.

Signed and Sealed this

Twenty-third Day of November 1976

[SEAL]

Attest:

RUTH C. MASON
Attesting Officer

C. MARSHALL DANN
Commissioner of Patents and Trademarks